US007254801B1

(12) United States Patent
Borer et al.

(10) Patent No.: US 7,254,801 B1
(45) Date of Patent: Aug. 7, 2007

(54) SYNTHESIS AWARE PLACEMENT: A NOVEL APPROACH THAT COMBINES KNOWLEDGE OF POSSIBLE RESYNTHESIS

(75) Inventors: Terry Borer, Toronto (CA); Deshanand Singh, Mississauga (CA); Stephen Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 326 days.

(21) Appl. No.: 11/040,323

(22) Filed: Jan. 20, 2005

(51) Int. Cl.
*G06F 17/50* (2006.01)

(52) U.S. Cl. .............................. 716/16; 716/18; 716/17

(58) Field of Classification Search ................... 716/16, 716/18, 17
See application file for complete search history.

(56) References Cited

U.S. PATENT DOCUMENTS

| | | | | |
|---|---|---|---|---|
| 5,754,824 | A * | 5/1998 | Damiano et al. | 716/18 |
| 6,324,678 | B1 * | 11/2001 | Dangelo et al. | 716/18 |
| 6,487,708 | B1 * | 11/2002 | Canaris | 716/10 |
| 6,526,559 | B2 * | 2/2003 | Schiefele et al. | 716/16 |
| 7,003,743 | B2 * | 2/2006 | Abadir et al. | 716/4 |
| 2002/0073380 | A1 * | 6/2002 | Cooke et al. | 716/1 |
| 2002/0157071 | A1 * | 10/2002 | Schiefele et al. | 716/6 |
| 2002/0162086 | A1 * | 10/2002 | Morgan | 716/18 |
| 2004/0103377 | A1 * | 5/2004 | Eaton et al. | 716/1 |
| 2005/0096884 | A1 * | 5/2005 | Fishkin et al. | 703/1 |

OTHER PUBLICATIONS

Kumthekar et al., "Power and Delay Reduction via Simultaneous Logic and Placement Optimization in FPGAs", Proceedings of Design, Automation and Test in Europe Conference and Exhibition, Mar. 27-30, 2000, pp. 202-207.*
Shin et al., "Performance-Oriented Technology Mapping for LUT-Based FPGAs", IEEE Transactions on Very Large Scale Integration (VLSI) Systems, vol. 3, No. 2, Jun. 1995, pp. 323-327.*
Chang et al., "A Weighted Technique for Programmable Logic Devices Minimization", Proceedings of the 23rd Annual Workshop and Symposium on Microprogramming and Microarchitecture, Nov. 27-29, 1990, pp. 267-274.*
Schabas, Karl, et al., "Using Logic Duplication to Improve Performance in FPGAs", *ACM/SIGDA 11th ACM International Symposium on Field Programmable Gate Arrays*, Feb. 23-25, 2003, pp. 136-142.

* cited by examiner

*Primary Examiner*—Phallaka Kik
(74) *Attorney, Agent, or Firm*—Townsend and Townsend and Crew (57) ABSTRACT

A system and method improves the effectiveness of logic duplication optimizations by dynamically allocating the usage of logic duplicates. Duplicate atoms in the user design are identified. Atoms satisfying heuristics can also be duplicated and added to the user design. During placement, a duplicate-aware cost function is used to determine the location on the programmable device of atoms driven by a duplicate atom. The duplicate-aware cost function evaluates the suitability of a potential location of a driven atom with respect to a source atom and any duplicates of the source atom. Following placement of the atoms of the user design, a rewiring phase establishes a connection between each driven atom and one of the duplicated source atoms. The duplicate-aware cost function can be used to evaluate sets of duplicate source atoms to optimize the operating speed, power consumption, and/or routability of a user design.

40 Claims, 11 Drawing Sheets

SYNTHESIS AWARE PLACEMENT: A NOVEL APPROACH THAT COMBINES KNOWLEDGE OF POSSIBLE RESYNTHESIS

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permutated over the hardware architecture of the programmable device in order to match elements of the user design with corresponding portions of the programmable device. The clustering, placement, and routing phases assign the various portions of the user design to specific logic cells and functional blocks and determine the configuration of the configurable switching circuit used to route signals between these logic cells and functional blocks, taking care to satisfy the user timing constraints as much as possible. In the assembly phase, a configuration file defining the programmable device configuration is created. The configuration can then be loaded into a programmable device to implement the user design.

To improve the performance of a user design implemented on a programmable device, additional optimization phases can be used to optimize the user design. For example, optimization phases can improve the maximum operating speed of the user design or decrease the amount of power required by the user design. One type of optimization phase duplicates portions of the user design in different sections of the programmable device. This type of optimization phase, referred to as logic duplication, uses the duplicate portions of the user design to minimize the signal delay on timing critical paths in the user design, thereby increasing the maximum operating speed of the user design.

Typically, a substantial portion of the signal delay in a user design is determined by the locations of the various portions of the user design on the programmable device. These locations are typically determined during the placement phase of the compilation of the user design. Some prior logic duplication phases are applied to the user design before the placement phase and thus before the locations of the portions of the user design and their associated signal delays have been determined. Because these types of logic duplication phases lack accurate signal delay information, they must essentially guess at the optimal use of the duplicate portions of the user design. As a result, user design performance is rarely optimal.

Conversely, other prior logic duplication phases are applied to the user design after the placement phase. Although these types of logic duplication phases have placement information and thus can estimate signal delay more accurately, the locations of the duplicate portions of the user design have already been fixed; thus the duplicate portions of the user design are often underutilized because they provide little or no reduction in signal delay.

It is therefore desirable for a system and method to improve the effectiveness of logic duplication optimizations. It is further desirable to dynamically allocate the usage of logic duplicates in the user design to maximize the utilization of logic duplicates. It is also desirable to utilize logic duplication optimizations in one or more phases of compilation. It is desirable to apply logic duplication optimizations to a user design to reduce signal delays, improve the routing of connections, and/or decrease power requirements.

BRIEF SUMMARY OF THE INVENTION

An embodiment of the invention is a system and method that improves the effectiveness of logic duplication optimizations by dynamically allocating the usage of logic duplicates. Duplicate atoms in the user design are identified. Atoms satisfying heuristics can also be duplicated and added to the user design. During placement, a duplicate-aware cost function is used to determine the location on the programmable device of atoms driven by a duplicate atom. The duplicate-aware cost function evaluates the suitability of a potential location of a driven atom with respect to a source atom and any duplicates of the source atom. Following placement of the atoms of the user design, a rewiring phase establishes a connection between each driven atom and one of the duplicated source atoms. The duplicate-aware cost function can be used to evaluate sets of duplicate source atoms to optimize the operating speed, power consumption, and/or routability of a user design.

In an embodiment, a method of determining the configuration of a programmable device includes identifying a set of duplicate atoms in a user design and determining a portion of a configuration of a programmable device for an atom driven by one of the set of duplicate atoms using a duplicate-aware cost function. The method evaluates the performance of each a set of potential connections between the atom and each of the set of duplicate atoms, selects one of the set of potential connections providing performance greater than the performance of at least a portion of the set of potential connections, and establishes a connection between the atom and one of the set of duplicate atoms in accordance with the selected one of the set of potential connections.

The portion of the programmable device configuration may include a grouping of the atom with at least one additional atom of the user design. In an additional embodiment, the grouping corresponds with a logic array block of a programmable device. The portion of the programmable device configuration may include a location of the atom on the programmable device. The portion of the programmable device configuration may include the route of the selected one of the set of potential connections on the programmable device. In an embodiment, the route is through a configurable switching circuit of the programmable device adapted to be configured by a memory. In another embodiment, the route is through configurable switching circuit of the programmable device adapted to be configured by a mask.

In an additional embodiment, the duplicate-aware cost function includes a signal timing factor providing the minimum of the estimated signal delays for a potential connection between the atom and each of the set of duplicate atoms. In an alternate embodiment, the duplicate-aware cost function includes a power consumption factor providing the minimum of the estimated power consumptions of a potential connection between the atom and each of the set of duplicate atoms. In yet another embodiment, the duplicate-aware cost function includes a routability factor providing the minimum of the estimated routing costs to establish a connection between the atom and each of the set of duplicate atoms.

BRIEF DESCRIPTION OF THE DRAWINGS

The invention will be described with reference to the drawings, in which.

In the drawings, the use of identical reference numbers in different drawings indicates similar components.

DETAILED DESCRIPTION OF THE INVENTION

Figure 1:
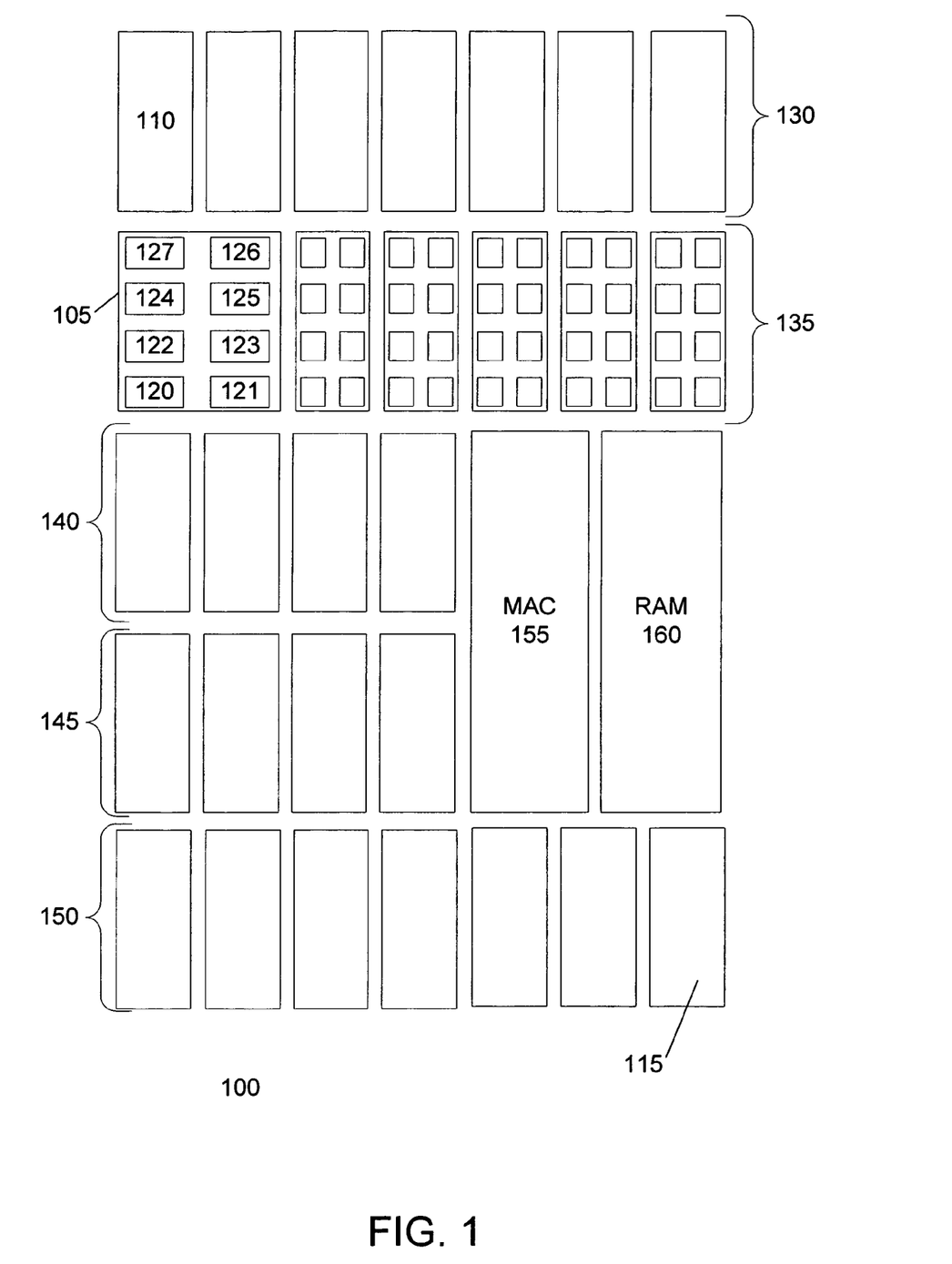
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 100 also include specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include thousands or tens of thousands of these elements.

Figure 2:
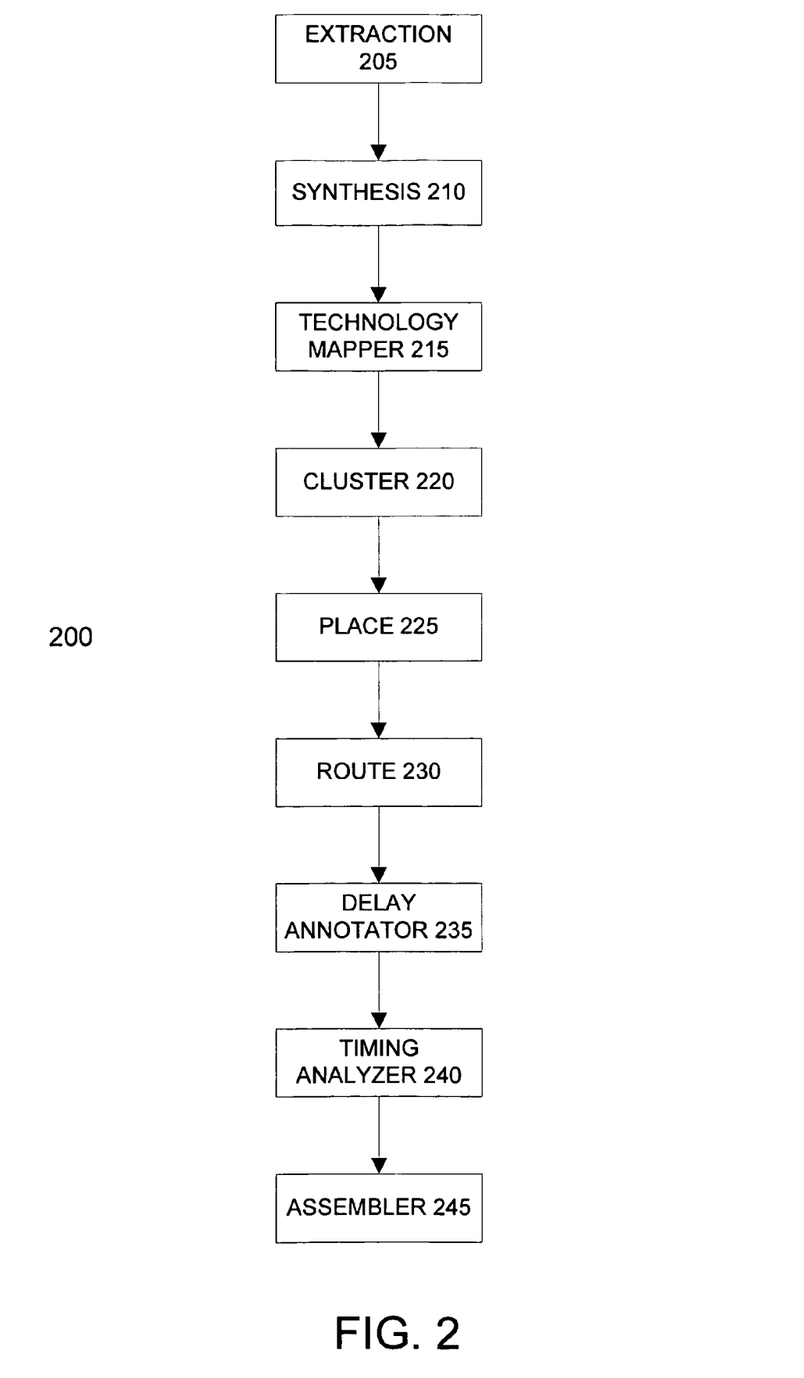
FIG. 2 illustrates the phases of a typical compilation process suitable for implementing an embodiment of the invention.

FIG. 2 illustrates the phases of a typical compilation process 200 suitable for implementing an embodiment of the invention. The compilation process 200 converts a user design into a programmable device configuration adapted to configure a programmable device to implement the user design. The extraction phase 205 converts a description of the user design, expressed for example in a hardware description language, into a register transfer layer description.

Synthesis phase 210 converts the register transfer layer description of the user design into a set of logic gates. Technology mapping phase 215 subdivides the set of logic gates into a set of atoms, which are irreducible constituents of the user design. In an embodiment, atoms correspond to groups of logic gates and other components of the user design matching the capabilities of the logic cells or other functional blocks of the programmable device. A given user design may be converted into any number of different sets of atoms, depending upon the underlying hardware of the programmable device used to implement the user design.

Following the technology mapping phase 215, the cluster phase 220 groups related atoms together into clusters. The place phase 225 assigns clusters of atoms to locations on the programmable device. The route phase 230 determines the configuration of the configurable switching circuit of the programmable device used to connect the atoms implementing the user design.

The delay annotator phase 235 determines the signal delays for the set of atoms and their associated connections in the configurable switching circuit using a timing model of the programmable device. The timing analysis phase 240 determines the maximum operating speed of the programmable device when implementing the user design, for example by determining the portions of the user design have the largest signal delay.

The assembler phase 245 generates a set of configuration information specifying the configuration of the programmable device implementing the user design, including the configuration of each of the logic cells used to implement the user design and the configuration of the configurable switching circuit used to connect the logic cells. The assembler phase 245 can write the configuration information to a configuration file, which can then be used to configure one or more programmable devices to implement instances of the user design.

Figure 3A:
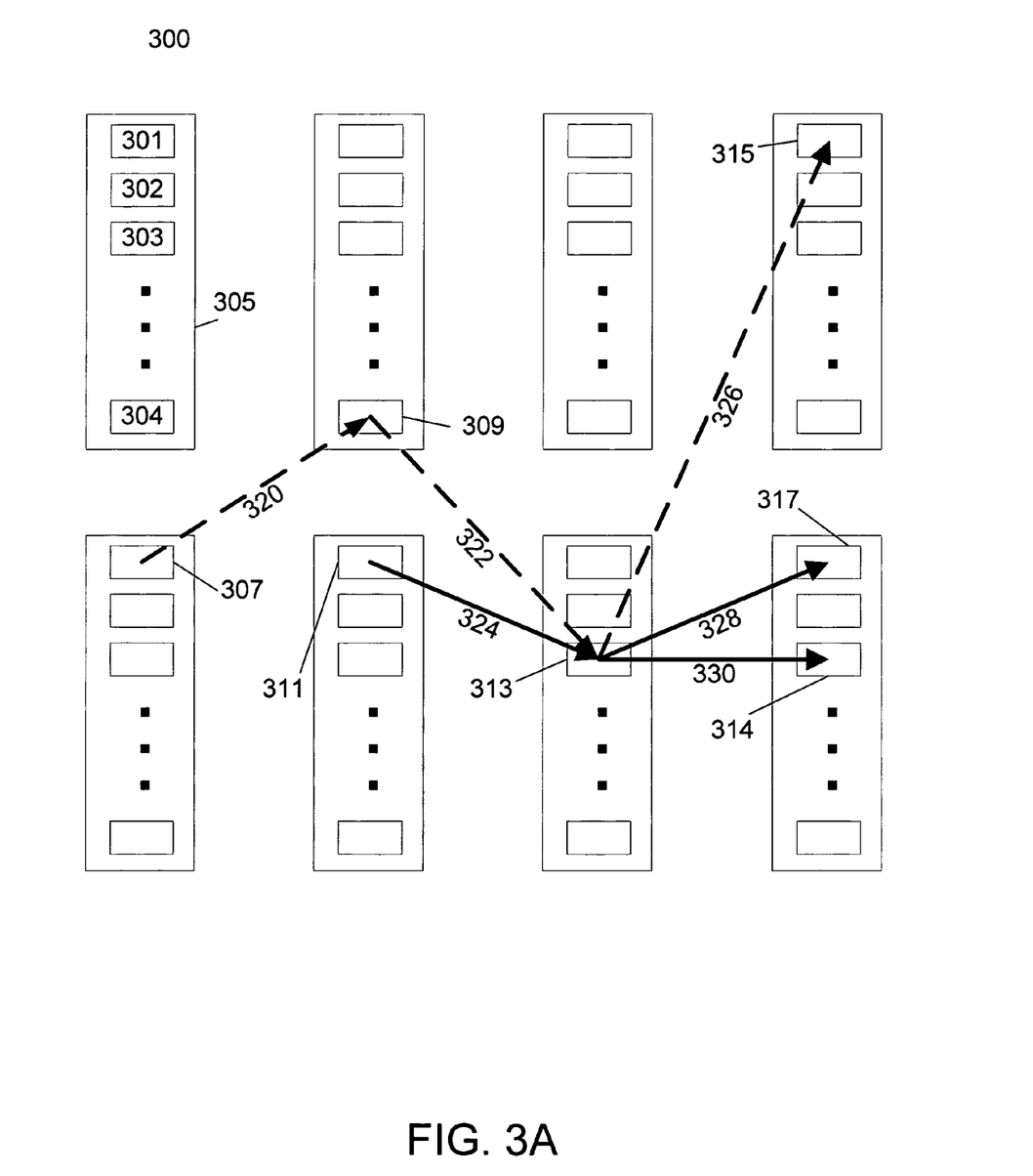
FIGS. 3A-B illustrate an example optimization of a user design according to an embodiment of the invention.
Figure 3B:
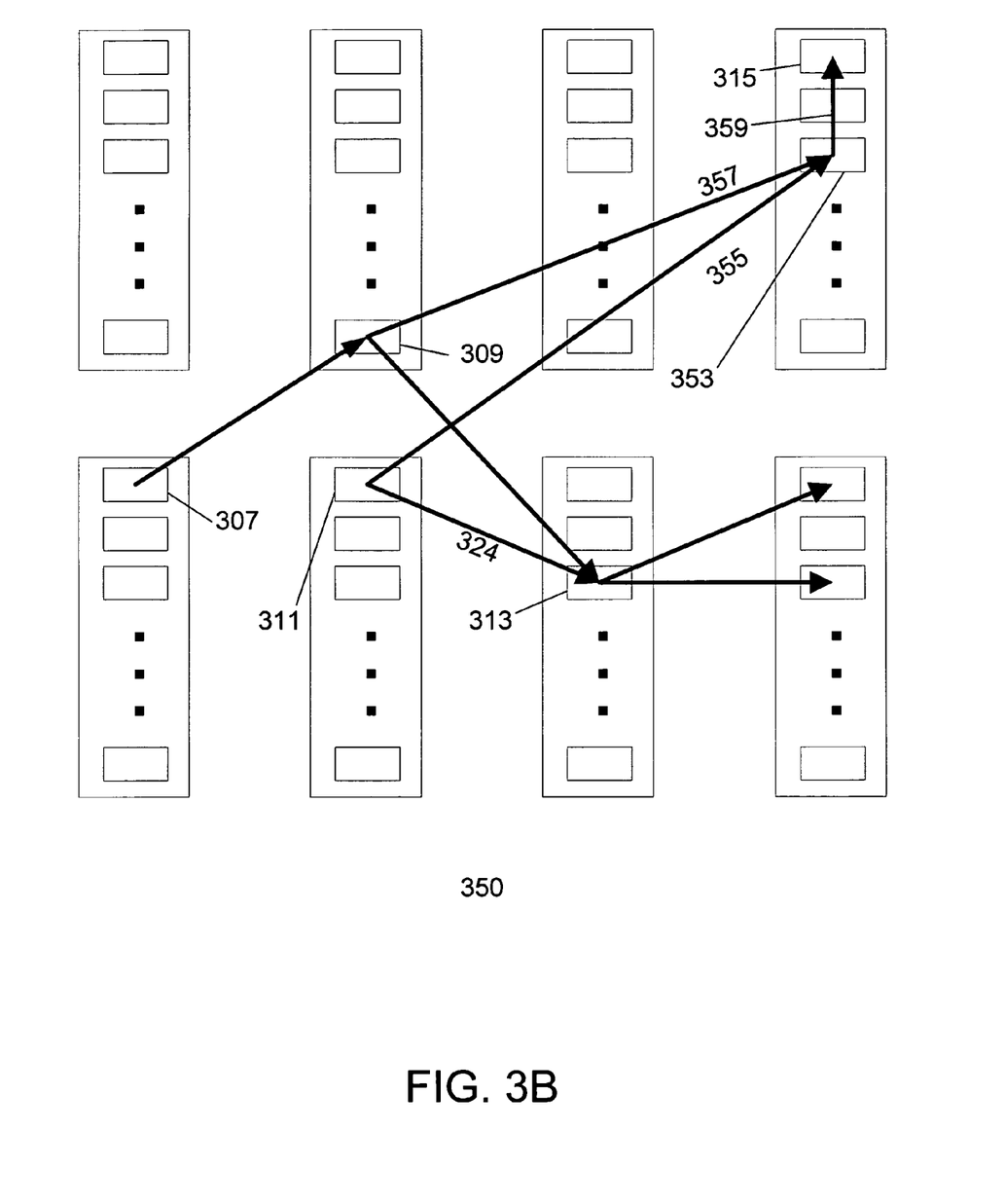

FIGS. 3A-B illustrate an example optimization of a user design according to an embodiment of the invention. FIG. 3A illustrates the configuration of a portion 300 of a programmable device. In this example, the programmable device includes a number of logic cells grouped into logic array blocks, as discussed above. For example, LAB 305 includes logic cells 301, 302, 303, and 304. A set of connected logic cells, including logic cells 307, 309, 311, 313, 315, 317, and 319 implement at least a portion of a user design. Signals are carried between logic cells using connections 320, 322, 324, 326, 328, and 330. In these figures, the connections between logic cells are shown in abstract, and the actual routes between logic cells will depend upon the topology of the configurable switching circuit of the programmable device. Nonetheless, the typical signal delay of a connection is roughly proportional to the distance between the associated logic cells. In FIGS. 3A and 3B, timing critical signal paths are illustrated with dashed lines, while non-timing critical signal paths are illustrated with solid lines.

To optimize a user design, an embodiment of the invention duplicates the functions of one or more logic cells on timing-critical signal paths over two or more logic cells. The duplicate logic cells can be located closer to their destinations logic cells, thereby decreasing the distance between logic cells and reducing signal delay on timing-critical signal paths.

FIG. 3B illustrates the configuration of a portion 350 of a programmable device. Portion 350 is an optimized version of portion 300 discussed above. In portion 350, the functions of logic cell 313 have been duplicated in logic cell 353. The timing-critical connections 322 and 326 with logic cell 313 in FIG. 3A have been replaced with non-critical connections 357 and 359 with duplicate logic cell 353 in FIG. 3B. Additionally, to ensure that the function of the user design is unchanged by this optimization, logic cell 311 is connected with both logic cell 313, via connection 324, and with duplicate logic cell 353, via connection 355. Because the length of paths 357 and 359 are less than the length of paths 322 and 326, the signal delay in this portion of the design is reduced.

Figure 4:
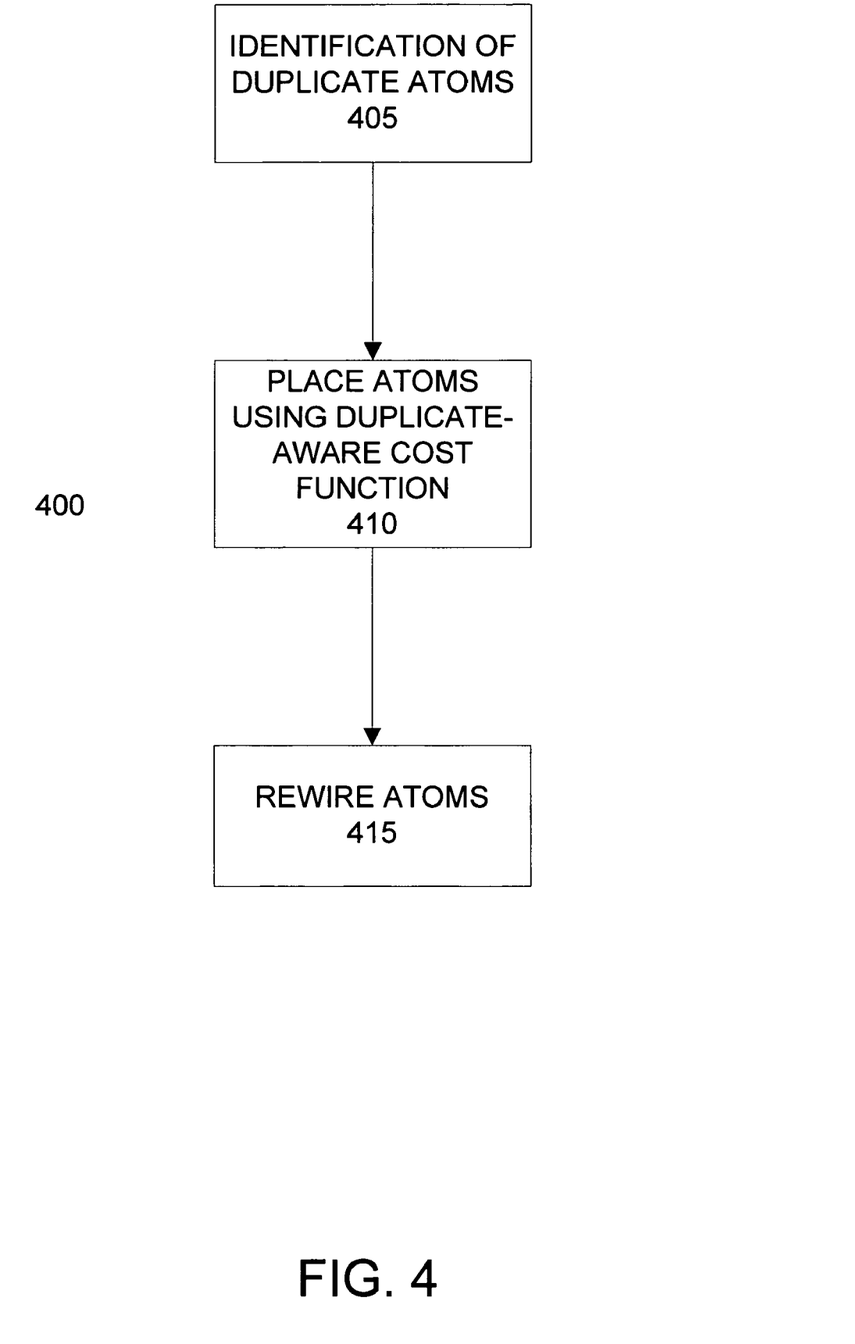
FIG. 4 is a flowchart illustrating an optimization method according to an embodiment of the invention.

FIG. 4 is a flowchart 400 illustrating an optimization method according to an embodiment of the invention. In general, this embodiment of the invention is applicable to any type of atom in a user design. An atom is a portion of the user design capable of being implemented by a logic cell. Atoms can include one or more data registers, combinatorial logic gates, lookup tables, and/or other functional blocks. During the execution of the method of flowchart 400, additionally compilation phases, such as those discussed with respect to FIG. 2 above, may be performed. These additional compilation phases have been omitted from flowchart 400 for clarity.

Figure 5A:
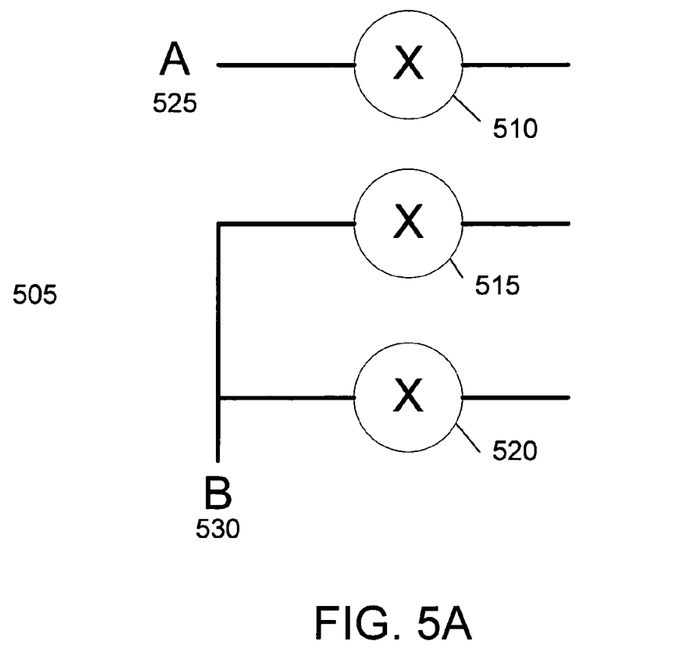
FIGS. 5A-B illustrate examples of duplicate atoms utilized by an embodiment of the invention.
Figure 5B:
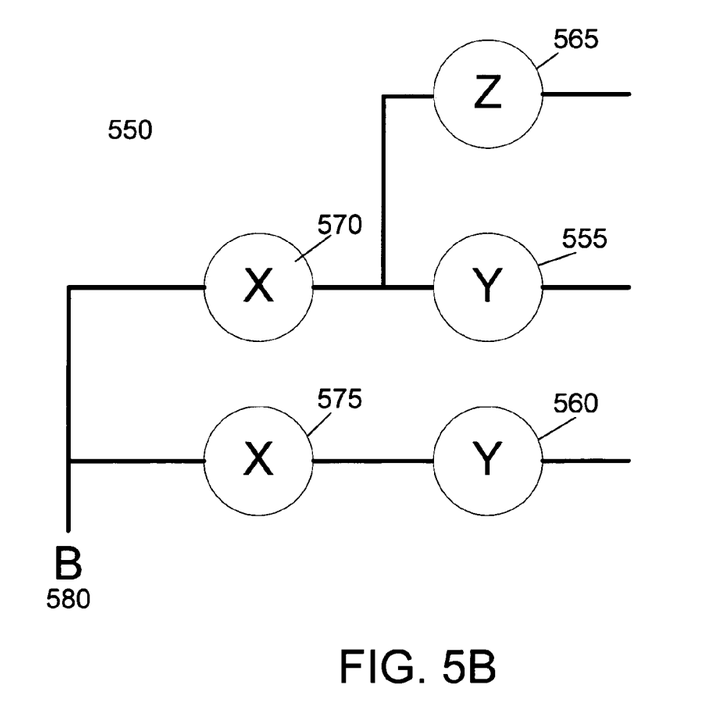

Step 405 identifies and/or creates sets of duplicate atoms. A set of duplicate atoms includes at least two atoms that implement the same logic function under all input conditions. The identity of a pair of atoms can be determined from a direct comparison of the atoms or recursively. FIGS. 5A-B illustrate examples of duplicate atoms utilized by an embodiment of the invention. FIG. 5A shows a set of atoms 505 including atoms 510, 515, and 520. In this example, atoms 510 and 515 are connected with input signal 530 and atom 510 is connected with input signal 525. Although atoms 510, 515, and 520 all have the same function, "X," only atoms 515 and 520 have the same inputs and therefore are duplicates.

FIG. 5B shows a set of atoms 550 including atoms 555, 560, 565, 570, and 575. In this example, atoms 570 and 575 are connected with input signal 580. In this example, atoms 570 and 575 are duplicates because they have the same function and are both connected directly with the input signal 580. Additionally, atoms 555 and 560 are duplicates because they each have the same function, "Y," and are indirectly connected with the same input signal 580 via duplicate atoms 570 and 575, respectively. Although atom 565 is also connected with the same input signal as atoms 555 and 560, atom 565 is not a duplicate of these atoms because it has a different function, "Z."

Step 405 compares all of the atoms of the user design to identify one or more sets of duplicate atoms. Additionally, an embodiment of step 405 adds duplicate atoms to the user design to optimize the user design. In an embodiment, heuristics are used to determine which atoms of the user design should be duplicated to improve performance. Example heuristics include: duplicating an atom on a timing-critical signal path; duplicating an atom including a register with two or more fan-outs; duplicating an atom associated with a high fan-out net; and/or duplicating an atom associated with a critical signal path as determined in a previous compilation. Unlike prior logic duplication methods, which permanently assign connections to either an atom or one of its duplicates, an embodiment of method 400 dynamically associates connections among a set of duplicate atoms.

Step 410 applies a placement phase to the user design to determine the location of each atom, including duplicate atoms, on a programmable device. Typically, placement phases employ a cost function to determine an optimal location for each atom. The cost function provides a metric of the quality of a given location for an atom. Typical cost functions for placement phases balance a number of factors for determining the suitability of a location of an atom, including factors such as signal delay and routability. For example, the cost function for an atom on a timing-critical signal path will reflect primarily the signal delay for the atom at that location. Conversely, for an atom on a non-critical signal path, the cost function will be comprised primarily of a measurement of the potential routing cost of the connections associated with the atom at a given location. Using the cost function of each atom to determine a total cost for a given configuration of the user design, the placement phase determines an optimal configuration of the user design by minimizing the total cost of the user design.

An embodiment of step 410 employs a duplicate-aware cost function to evaluate the placement of atoms of a user design. In an embodiment, the duplicate-aware cost function includes a signal delay factor. For a given atom, the signal delay factor takes into account the set of duplicate atoms connected with the given atom, if any, in determining the signal delay of the atom at a given location. For example, one formulation of the signal delay factor for an atom I is:

Delay$\{Ei\}$=Min$\{$Arrival_Time(all Sources $D$)|+
Delay$\{D{\rightarrow}I\}$,Arrival_Time(all Sources $D'$)+
Delay$(D'{\rightarrow}>I)$, . . .

In this formulation, Ei is a connection driven from a source atom D to atom I. D' is a duplicate source atom. The delay formulation can be expanded to handle additional source atoms (D", D''', etc.). In summary, the delay for a given atom I is the minimum delay from any of a set of duplicate source atoms to the given atom I. For any general duplicate source atom, the delay from the source atom (ex. D) to a given atom I is the arrival time of all of the sources to the source atom and the delay from the source atom to the given atom I.

For atoms including a register, the arrival time is typically zero because the register is synchronized with a clock signal. Thus, the formulation of the signal delay for a given atom I connected to a source register R can be simplified to:

Delay$\{E_i\}$=Min$\{$Delay$\{R{\rightarrow}I\}$,Delay$\{R'{\rightarrow}I\}\}$

In this formulation, R and R' are duplicate source atoms (each including a register) connected with a given atom I. The signal delay factor can be expanded to handle additional source registers, similar to the other signal delay formulation discussed above.

In another embodiment, the cost function can be used to optimize the user design for other qualities, such as decreased power consumption. In this embodiment, the cost function includes a power consumption factor formulated similarly to the above signal delay factors, with a function estimating power consumption for a connection between a given atom I and a duplicate source atom being substituted for the Delay function.

Figure 6A:
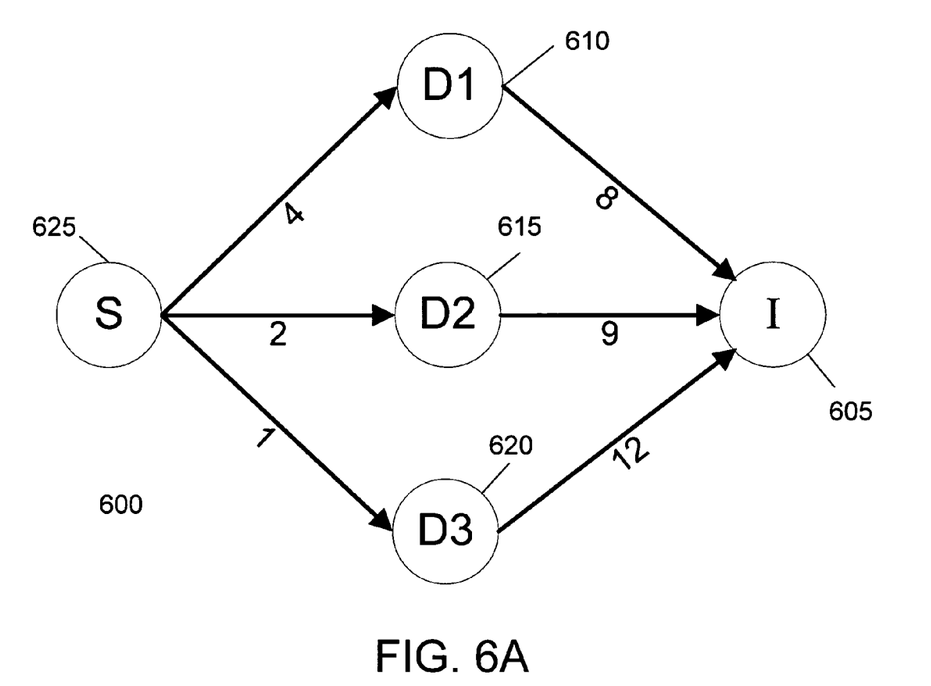
FIGS. 6A-B illustrate sets of signal delays associated with example duplicate atoms according to an embodiment of the invention.

FIGS. 6A-B illustrate sets of signal delays associated with example logic duplicates according to an embodiment of the invention. FIG. 6A illustrates an example application 600 of the former delay formulation to a set of general duplicate source atoms. Example 600 includes an atom 605 potentially connected with one of three source atoms D1, 610; D2, 615; and D3, 620. The signal delay factor for atom 605 is thus the minimum of signal delay from any of the source atoms. In this example, the delay for atom 610 is 4+8=12; for atom 615 is 2+9=11; and for atom 620 is 1+12. Thus, in this example, the minimum delay, and hence the signal delay factor for atom 605, is 11.

Figure 6B:
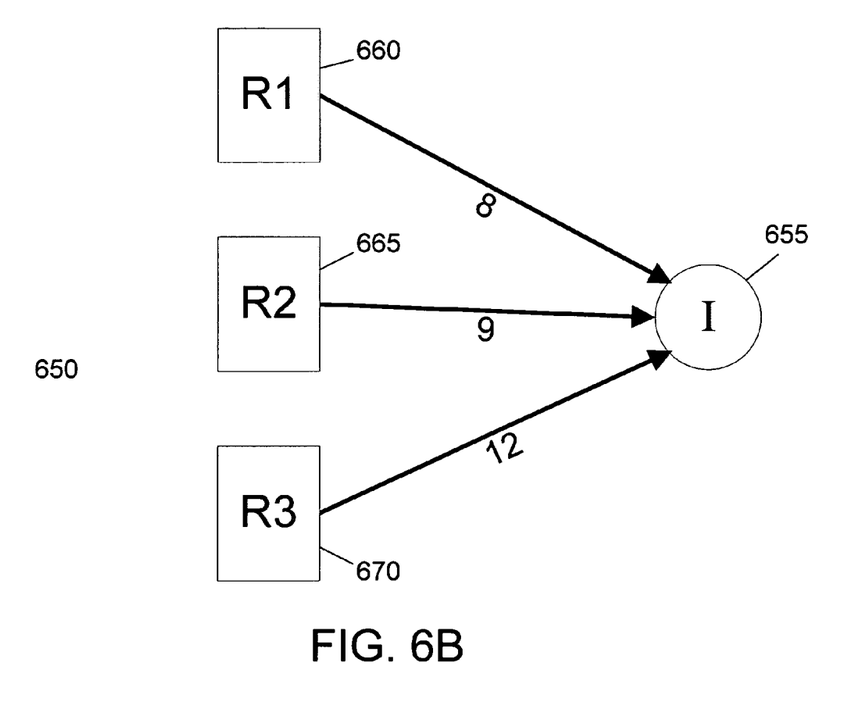

FIG. 6B illustrates an example application 650 of the latter delay formulation to a set of duplicate source registers. Example 650 includes an atom 655 potentially connected with one of three source registers R1, 660; R2, 665; and R3, 670. The signal delay factor for atom 655 is thus the minimum of signal delay from any of the source registers. In this example, the delay for register 660 is 8; for register 665 is 9; and for register 670 is 12. Thus, in this example, the minimum delay, and hence the signal delay factor for atom 605, is 8.

Using this duplicate-aware signal delay factor, the placement phase 410 will minimize the cost function of atoms on timing-critical signal paths by placing these atoms nearest to the duplicate source atoms that provide the greatest improvements in timing. In an embodiment, the connectivity of atoms to specific duplicate atoms is dynamically changed during the placement phase so that timing-critical atoms are always connected to their nearest duplicate. If the change in connectivity makes the placement illegal, then an embodiment of step 410 uses an illegality resolver to remove the illegal placement. Alternatively, step 410 does not change the connectivity of atoms unless the resulting placement is legal. In a further embodiment, placement phase 410 does not modify the connectivity of atoms. Instead, atoms are connected with their appropriate duplicate source atoms in the rewiring phase, discussed below.

Following the placement of atoms of the user design in step 410, the rewiring phase of step 415 modifies the connections to duplicate atoms. For each atom driven by one of a set of duplicate atoms, step 415 analyzes the set of potential connections between the atom and each one of the set of duplicate atoms. Step 415 selects the connection with the duplicate source atom that gives the best performance. In an embodiment, step 415 uses a cost function to evaluate the performance of each potential connection, taking into account factors such as the signal delay, routing resource usage, and area usage associated with each potential connection.

Figure 7A:
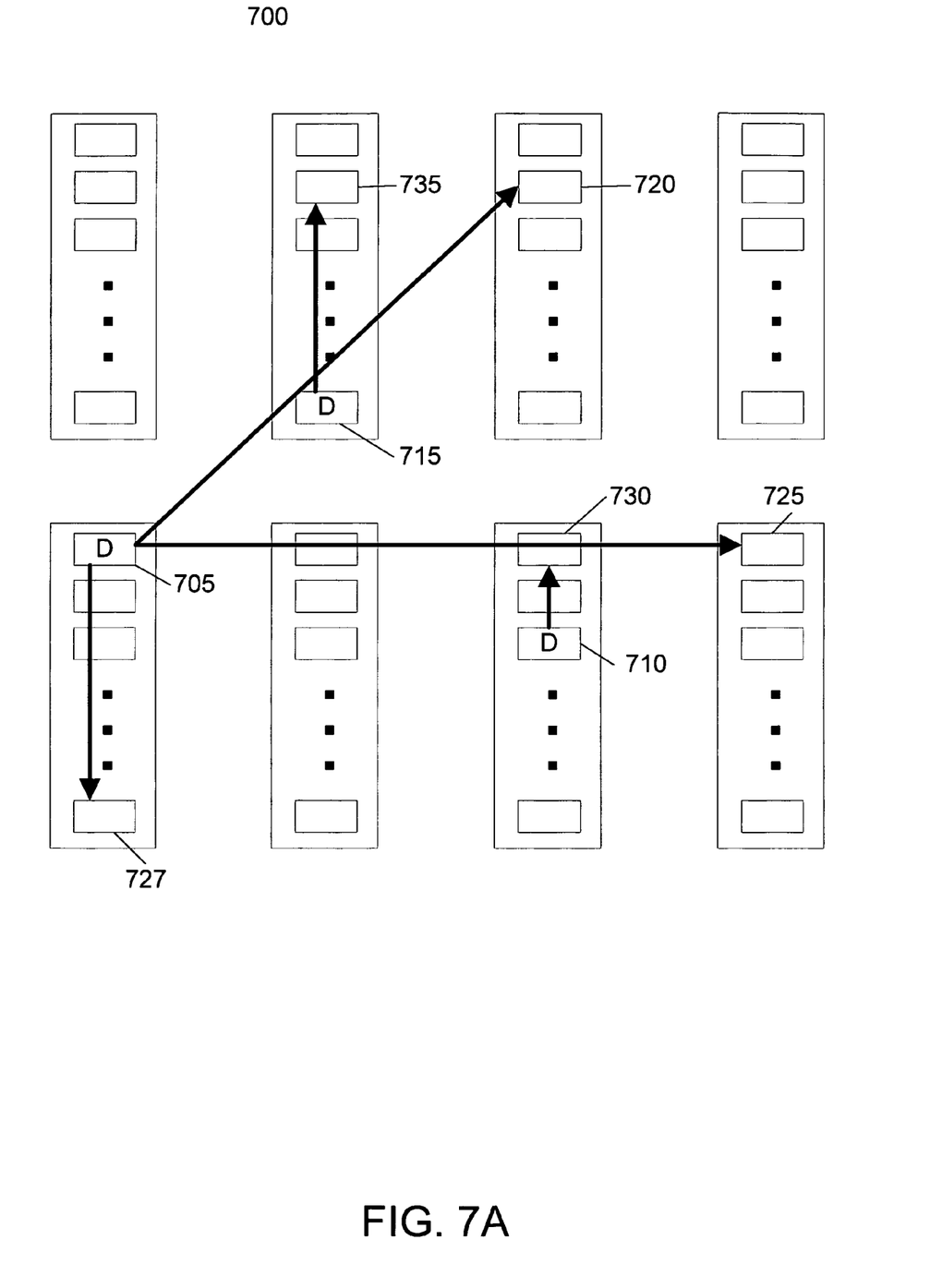
FIGS. 7A-B illustrate a set of connections with example duplicate atoms according to an embodiment of the invention.

FIGS. 7A-B illustrate a set of connections with example logic duplicates according to an embodiment of the invention. FIG. 7A illustrates the configuration of a portion 700 of a programmable device. In this example, the programmable device includes a number of logic cells grouped into logic array blocks, as discussed above. Following the placement phase, portion 700 includes a set of duplicate atoms 705, 710, and 715. The set of duplicate atoms are connected with other atoms of the user design, using connections determined prior to the placement phase. In this example, atom 705 drives atoms 720, 725, and 727; atom 710 drives atom 730; and atom 715 drives atom 735.

Figure 7B:
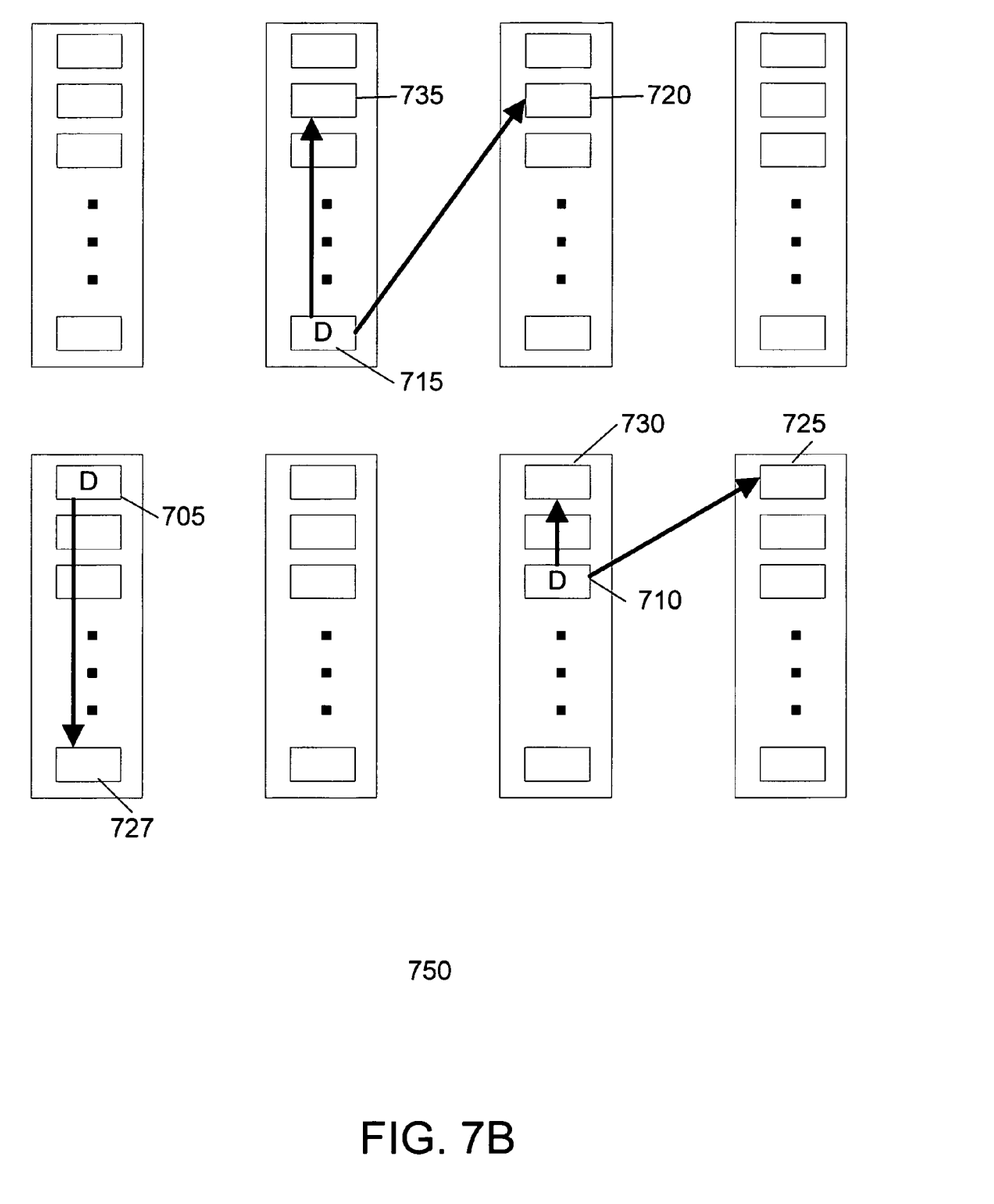

For each of the atoms 720, 725, 730, and 735, step 415 analyzes the set of potential connections with the set of duplicate atoms 705, 710, and 715 and selects the connection providing the best performance. FIG. 7B illustrates the portion 750 of the programmable device corresponding with portion 700 following the selection of connections according to step 415. Step 415 has changed the connections between atoms of the user design and their respective duplicate source atoms. In this example, duplicate atom 705 only drives atom 727; duplicate atom 710 drives atoms 725 and 730; and duplicate atom 715 drives atoms 720 and 735. Because the duplicate atoms 705, 710, and 715, by definition, have the same function and inputs, the modification of connections by step 415 does not change the function of the user design.

Figure 8:
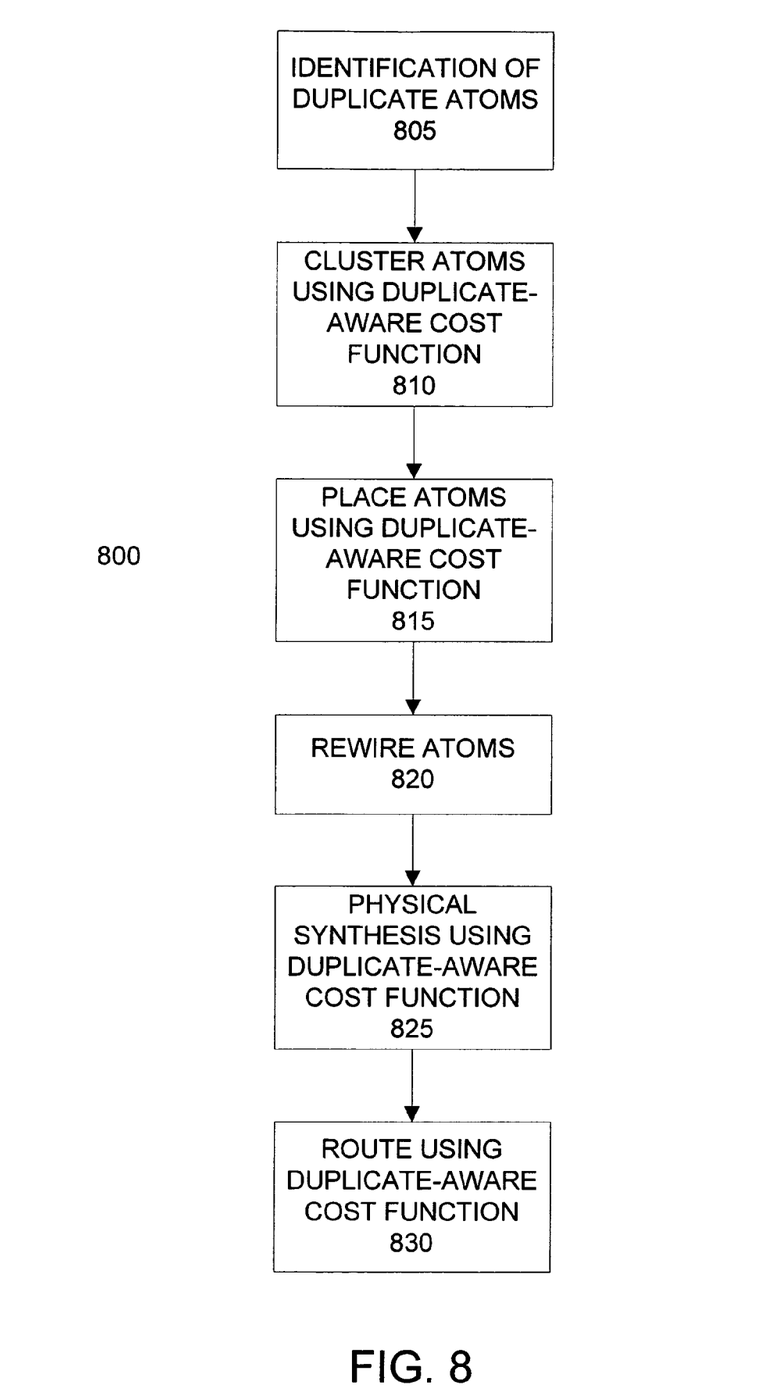
FIG. 8 is a flowchart illustrating an optimization method according to an embodiment of the invention.

In a further embodiment, compilation phases other than, or in addition to, the placement phase can use a duplicate-aware cost function to optimize a user design using sets of duplicate atoms. FIG. 8 is a flowchart 800 illustrating an optimization method according to an embodiment of the invention. In this embodiment, step 805 identifies sets of duplicate atoms, similar to step 405 discussed above.

Following the identification of one or more sets of duplicate atoms, step 820 performs a clustering phase. As discussed above, a typical programmable device groups sets of logic cells into logic array blocks (LABs). A clustering phase determines which atoms of the user design should be assigned to the same LAB. In an embodiment, the clustering phase of step 820 uses a duplicate aware cost function to determine the optimal groupings of atoms into LABs. For each atom driven by a duplicate source atom, the cost function uses a signal delay factor similar to those discussed above to assign this atom to a LAB including or located close to one of the set of duplicate source atoms.

Following the clustering of step 810, a placement phase 815 similar to placement phase 410 is performed. In an embodiment, the placement phase 815 determines the optimal location for each LAB of atoms by applying the cost functions discussed above to the atoms of each LAB. Step 820 then modifies the connections with sets of duplicate source atoms similar to step 415. Step 825 performs additional physical synthesis optimizations to the user design using a similar cost function.

Step 830 determines the routing of the connections between the atoms of the user design through the configurable switching circuit of the programmable device. Typically, a routing cost function is used to determine the optimal route through the configurable switching circuit for each connection in the user design. In an embodiment, the routing cost function uses a signal delay factor similar to those discussed above to determine the optimal route for each connection. In an additional embodiment, the routing cost function can consider other factors in evaluating duplicate atoms, such as the level of congestion in the configurable switching circuit and/or power consumption. Following step 830, a rewiring phase, similar to phase 415 discussed above, is performed to modify the connections with duplicate atoms.

Figure 9:
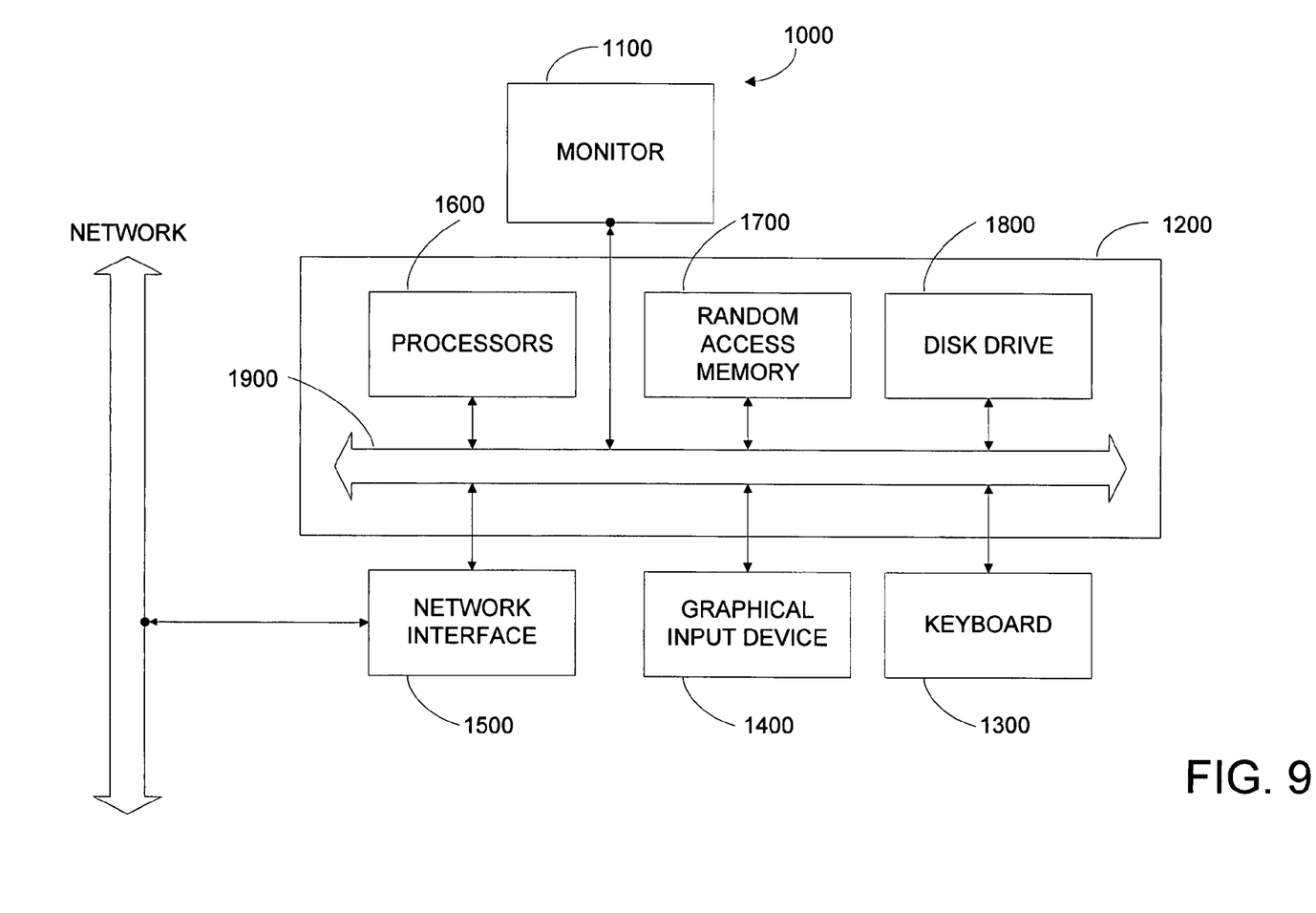
FIG. 9 illustrates an example computer system capable of implementing an embodiment of the invention.

FIG. 9 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices such as field programmable gate arrays, it is equally applicable to applications used to design any type of digital device, such as standard cell ASICs, structured or mask-programmable ASICs, PLDs, gate arrays, and general digital logic devices.

Structured ASICs are similar to FPGAs in that they contain an array of configurable logic blocks; however, the typical structured ASIC will contain metal layers that can be programmed, for example using mask programming techniques, to realize routing connections between logic elements. In some implementations, structured ASICs offer the same or similar logic cell architecture as FPGAs, but with mask-programmable metal layers in place of the configurable switching circuit.

Although the routing "switches" are not present in structured ASICs as they are in FPGAs, structured ASICs incur signal delays that are strongly correlated to the capacitive loads on a routed net, such as from the wires themselves, inserted buffers, and the logic cells at the sinks of each net. An embodiment of the invention is modified to account for these characteristics. These modifications can include a change to the placement cost function to account for additional capacitance encountered when "rewiring" from one duplicate to another.

Additionally, buffer insertion (unused logic cells used as buffers) is a widely used technique in structured ASICs that can be used to create a routing tree that has more linear delay characteristics than simple unbuffered routing structure. An embodiment of the invention can significantly impact of the buffering structure of a particular routed net. For example, rewiring can significantly change the total capacitance driven by the source of the net, and thus change the optimal buffering structure that is required. This will, in turn, change the delay experienced at each of the sinks of the net touched by rewiring. An embodiment of the invention accounts for this effect.

Furthermore, for structured ASICs, the intentional creation of duplicates early in the flow may be significantly different from FPGA implementations. Structured ASICs typically have a strong bias for creating nets with high numbers of fan-outs. With FPGAs, fully buffered interconnects cause fan-out to be an issue only in situations where it has a strong effect on placement. Additionally, in structured ASICs, identifying critical signals can be difficult because the routing delay distribution is far different than typical FPGAs. In the structured ASICs, there relationship between delay and distance is relatively linear, in contrast with FPGAs, which have a flatter delay distribution. Most significantly, in structured ASICs, short stretches of interconnect are, in a relative sense, much faster than longer interconnect configurations.

In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of determining a configuration of a programmable device, the method comprising:
    identifying a set of duplicate atoms in a user design;
    determining a location for an atom driven by one of the set of duplicate atoms using a duplicate-aware cost function;
    determining performance of each a set of potential connections between the atom and each of the set of duplicate atoms;
    selecting one of the set of potential connections providing performance greater than the performance of at least a portion of the set of potential connections; and
    establishing a connection between the atom and one of the set of duplicate atoms in accordance with the selected one of the set of potential connections.

2. The method of claim 1, wherein the duplicate-aware cost function;
    includes a signal timing factor providing a minimum of an estimated signal delay for a potential connection between the atom and each of the set of duplicate atoms.

3. The method of claim 2, wherein the estimated signal delay for a potential connection between the atom and one of the set of duplicate atoms includes an estimated signal delay between the atom and the one of the set of duplicate atoms.

4. The method of claim 3, wherein at least one of the set of duplicate atoms includes a register.

5. The method of claim 3, wherein the estimated signal delay for a potential connection between the atom and one of the set of duplicate atoms includes the estimated signal delay between a source register and the one of the set of duplicate atoms.

6. The method of claim 1, wherein the duplicate-aware cost function;
    includes a power consumption factor providing a minimum of an estimated power consumption of a potential connection between the atom and each of the set of duplicate atoms.

7. The method of claim 1, wherein the duplicate-aware cost function includes a routability factor providing a minimum of an estimated routing cost to establish a connection between the atom and each of the set of duplicate atoms.

8. The method of claim 1, wherein identifying a set of duplicate atoms includes:
    identifying a first atom of the user design satisfying a heuristic; and
    adding a second atom to the user design, the second atom being a copy of the first atom;

wherein the set of duplicate atoms includes the first and second atoms.

9. A method of determining a configuration of a programmable device, the method comprising:
identifying a set of duplicate atoms in a user design;
determining a portion of a configuration of a programmable device for an atom driven by one of the set of duplicate atoms using a duplicate-aware cost function;
determining performance of each a set of potential connections between the atom and each of the set of duplicate atoms;
selecting one of the set of potential connections providing performance greater than the performance of at least a portion of the set of potential connections; and
establishing a connection between the atom and one of the set of duplicate atoms in accordance with the selected one of the set of potential connections.

10. The method of claim 9, wherein the portion of the programmable device configuration includes a grouping of the atom with at least one additional atom of the user design.

11. The method of claim 10, wherein the grouping corresponds with a logic array block of a programmable device.

12. The method of claim 9, wherein the portion of the programmable device configuration includes a location of the atom on the programmable device.

13. The method of claim 9, wherein the portion of the programmable device configuration includes a route of the selected one of the set of potential connections on the programmable device.

14. The method of claim 13, wherein the route is through a configurable switching circuit of the programmable device adapted to be configured by a memory.

15. The method of claim 13, wherein the route is through configurable switching circuit of the programmable device adapted to be configured by a mask.

16. The method of claim 9, wherein the duplicate-aware cost function includes a signal timing factor providing a minimum of an estimated signal delay for a potential connection between the atom and each of the set of duplicate atoms.

17. The method of claim 9, wherein the duplicate-aware cost function includes a power consumption factor providing a minimum of an estimated power consumption of a potential connection between the atom and each of the set of duplicate atoms.

18. The method of claim 9, wherein the duplicate-aware cost function includes a routability factor providing a minimum of an estimated routing cost to establish a connection between the atom and each of the set of duplicate atoms.

19. The method of claim 18, wherein the estimated routing cost includes a routing congestion associated with the connection.

20. The method of claim 9, wherein identifying a set of duplicate atoms includes:
identifying a first atom of the user design satisfying a heuristic; and
adding a second atom to the user design, the second atom being a copy of the first atom;
wherein the set of duplicate atoms includes the first and second atoms.

21. An information storage medium including a plurality of instructions adapted to direct an information processing device to perform a set of steps for determining a configuration of a programmable logic device, the set of steps comprising:
identifying a set of duplicate atoms in a user design;
determining a location for an atom driven by one of the set of duplicate atoms using a duplicate-aware cost function;
determining performance of each a set of potential connections between the atom and each of the set of duplicate atoms;
selecting one of the set of potential connections providing performance greater than the performance of at least a portion of the set of potential connections; and
establishing a connection between the atom and one of the set of duplicate atoms in accordance with the selected one of the set of potential connections.

22. The information storage medium of claim 21, wherein the duplicate-aware cost function includes a signal timing factor providing a minimum of an estimated signal delay for a potential connection between the atom and each of the set of duplicate atoms.

23. The information storage medium of claim 22, wherein the estimated signal delay for a potential connection between the atom and one of the set of duplicate atoms includes an estimated signal delay between the atom and the one of the set of duplicate atoms.

24. The information storage medium of claim 23, wherein at least one of the set of duplicate atoms includes a register.

25. The information storage medium of claim 23, wherein the estimated;
signal delay for a potential connection between the atom and one of the set of duplicate atoms includes the estimated signal delay between a source register and the one of the set of duplicate atoms.

26. The information storage medium of claim 21, wherein the duplicate-aware cost function includes a power consumption factor providing a minimum of an estimated power consumption of a potential connection between the atom and each of the set of duplicate atoms.

27. The information storage medium of claim 21, wherein the duplicate-aware cost function includes a routability factor providing a minimum of an estimated routing cost to establish a connection between the atom and each of the set of duplicate atoms.

28. The information storage medium of claim 21, wherein identifying a set of duplicate atoms includes:
identifying a first atom of the user design satisfying a heuristic; and
adding a second atom to the user design, the second atom being a copy of the first atom;
wherein the set of duplicate atoms includes the first and second atoms.

29. An information storage medium including a plurality of instructions adapted to direct an information processing device to perform a set of steps for determining a configuration of a programmable logic device, the set of steps comprising:
identifying a set of duplicate atoms in a user design;
determining a portion of a configuration of a programmable device for an atom driven by one of the set of duplicate atoms using a duplicate-aware cost function;
determining performance of each a set of potential connections between the atom and each of the set of duplicate atoms;
selecting one of the set of potential connections providing performance greater than the performance of at least a portion of the set of potential connections; and
establishing a connection between the atom and one of the set of duplicate atoms in accordance with the selected one of the set of potential connections.

30. The information storage medium of claim 29, wherein the portion of the programmable device configuration includes a grouping of the atom with at least one additional atom of the user design.

31. The information storage medium of claim 30, wherein the grouping corresponds with a logic array block of a programmable device.

32. The information storage medium of claim 29, wherein the portion of the programmable device configuration includes a location of the atom on the programmable device.

33. The information storage medium of claim 29, wherein the portion of the programmable device configuration includes a route of the selected one of the set of potential connections on the programmable device.

34. The information storage medium of claim 33, wherein the route is through a configurable switching circuit of the programmable device adapted to be configured by a memory.

35. The information storage medium of claim 33, wherein the route is through configurable switching circuit of the programmable device adapted to be configured by a mask.

36. The information storage medium of claim 29, wherein the duplicate-aware cost function includes a signal timing factor providing a minimum of an estimated signal delay for a potential connection between the atom and each of the set of duplicate atoms.

37. The information storage medium of claim 29, wherein the duplicate-aware cost function includes a power consumption factor providing a minimum of an estimated power consumption of a potential connection between the atom and each of the set of duplicate atoms.

38. The information storage medium of claim 29, wherein the duplicate-aware cost function includes a routability factor providing a minimum of an estimated routing cost to establish a connection between the atom and each of the set of duplicate atoms.

39. The information storage medium of claim 38, wherein the estimated routing cost includes a routing congestion associated with the connection.

40. The information storage medium of claim 29, wherein identifying a set of duplicate atoms includes:
  identifying a first atom of the user design satisfying a heuristic; and
  adding a second atom to the user design, the second atom being a copy of the first atom;
  wherein the set of duplicate atoms includes the first and second atoms.

* * * * *